(12) United States Patent
Anand

(10) Patent No.: US 10,007,604 B2
(45) Date of Patent: *Jun. 26, 2018

(54) STORAGE DEVICE OPTIMIZATION

(71) Applicant: INTERNATIONAL BUSINESS MACHINES CORPORATION, Armonk, NY (US)

(72) Inventor: Vishal Anand, Bangalore (IN)

(73) Assignee: International Business Machines Corporation, Armonk, NY (US)

(*) Notice: Subject to any disclaimer, the term of this patent is extended or adjusted under 35 U.S.C. 154(b) by 0 days. days.

This patent is subject to a terminal disclaimer.

(21) Appl. No.: 15/397,079

(22) Filed: Jan. 3, 2017

(65) Prior Publication Data
US 2017/0212834 A1    Jul. 27, 2017

Related U.S. Application Data

(63) Continuation of application No. 15/003,250, filed on Jan. 21, 2016, now Pat. No. 9,588,694.

(51) Int. Cl.
*G06F 12/00* (2006.01)
*G06F 12/06* (2006.01)
*G06F 12/02* (2006.01)

(52) U.S. Cl.
CPC ...... *G06F 12/0607* (2013.01); *G06F 12/0246* (2013.01)

(58) Field of Classification Search
CPC ............... G06F 3/0608; G06F 3/0673; G06F 17/30138; G06F 3/0643; G06F 3/064; G06F 2212/401; H03M 7/30

(Continued)

(56) References Cited

U.S. PATENT DOCUMENTS 5,237,460 A    8/1993 Miller et al.
5,237,675 A    8/1993 Hannon, Jr.
(Continued)

FOREIGN PATENT DOCUMENTS

EP    2404251    1/2012

OTHER PUBLICATIONS

B, Praveen et al.; Design and Implementation of a File System with on-the-fly Data Compression for GNU/Linux; Internet URL: http://www.cse.iitk.ac.in/users/moona/papers/spe99.pdf; retrieved on Jul. 3, 2015; 21 pages.

(Continued)

*Primary Examiner* — Yaima Rigol
*Assistant Examiner* — Tasnima Matin
(74) *Attorney, Agent, or Firm* — Schmeiser, Olsen & Watts; John Pivnichny

(57) ABSTRACT

A method and apparatus for implementing a storage optimization process is provided. The method includes identifying a file for storage on a storage device. The storage device determines that the file comprises a file size that exceeds multiple physical disk blocks of the storage device by a fractional value. The file is divided into a first portion and a second portion. The first portion comprises a file size such that the first portion fits entirely within a first single block of the storage device. The second portion comprises a size such that the second portion exceeds a size of a second single block of the storage device by the fractional value. The first portion is stored within the first single block. The second portion is compressed such that a resulting compressed file fits entirely within the second single block.

20 Claims, 4 Drawing Sheets

(58) Field of Classification Search
USPC .......................................................... 711/103
See application file for complete search history.

(56) References Cited

U.S. PATENT DOCUMENTS

| | | |
|---|---|---|
| 5,394,534 A | 2/1995 | Kulakowski et al. |
| 5,490,260 A | 2/1996 | Miller et al. |
| 5,666,560 A | 9/1997 | Moertl et al. |
| 5,956,504 A | 9/1999 | Jagadish et al. |
| 7,451,290 B2 | 11/2008 | Chandrasekaran et al. |
| 7,974,478 B2 | 7/2011 | Bashyam et al. |
| 8,271,689 B2 | 9/2012 | Bannoura et al. |
| 8,788,713 B2 | 7/2014 | Amit et al. |
| 8,898,117 B2 | 11/2014 | Voll et al. |
| 2006/0184505 A1 | 8/2006 | Kedem et al. |
| 2007/0226402 A1 | 9/2007 | Kohinata et al. |
| 2014/0310493 A1 | 10/2014 | Pace |

OTHER PUBLICATIONS

Deorowicz, Sebastian et al.; Algorithms for Molecular Biology 2013, 8:25; Nov. 19, 2013; 13 pages.
Tretau, Roland et al.;IBM Real-time Compression Appliance Version 4.1; IBM Redbooks; Apr. 2013; 87 pages.
Office Action (dated May 19, 2016) for U.S. Appl. No. 15/003,250, filed Jan. 21, 2016.
Amendment filed Jul. 6, 2016 in response to Office Action (dated May 19, 2016) for U.S. Appl. No. 15/003,250, filed Jan. 21, 2016.
Notice of Allowance (dated Oct. 24, 2016) for U.S. Appl. No. 15/003,250, filed Jan. 21, 2016.

STORAGE DEVICE OPTIMIZATION

This application is a continuation application claiming priority to Ser. No. 15/003,250 filed Jan. 21, 2016, now U.S. Pat. No. 9,588,694, issued Mar. 7, 2017.

FIELD

The present invention relates generally to a method for optimizing storage within a storage device, and in particular to a method and associated system for equalizing and optimizing data block storage with a hardware storage device.

BACKGROUND

Maintaining information typically includes an inaccurate process with little flexibility. Efficiently storing the information may include a complicated process that may be time consuming and require a large amount of resources. Accordingly, there exists a need in the art to overcome at least some of the deficiencies and limitations described herein above.

SUMMARY

A first aspect of the invention provides a storage optimization method comprising: identifying, by a processor of a hardware storage device, a first file of a plurality of files for storage on the hardware storage device; determining, by the processor, that the first file comprises a first file size that exceeds first multiple physical disk blocks of the hardware storage device by a first fractional value; dividing, by the processor, the first file into a first portion and a second portion, wherein the first portion comprises a file size such that the first portion fits entirely within a first single block of the hardware storage device, wherein the second portion comprises a size such that the second portion exceeds a size of a second single block of the hardware storage device by the first fractional value, and wherein the second single block comprises a second to last sector/block of the hardware storage device; storing, by the processor, the first portion within the first single block; compressing, by the processor, the second portion of the first file such that a resulting compressed file fits entirely within the second single block of the hardware storage device; and storing, by the processor, the resulting compressed file within the second single block.

A second aspect of the invention provides a computing system comprising a processor coupled to a computer-readable memory unit, the memory unit comprising instructions that when executed by the processor executes a storage optimization method comprising: identifying, by the processor, a first file of a plurality of files for storage on the hardware storage device; determining, by the processor, that the first file comprises a first file size that exceeds first multiple physical disk blocks of the hardware storage device by a first fractional value; dividing, by the processor, the first file into a first portion and a second portion, wherein the first portion comprises a file size such that the first portion fits entirely within a first single block of the hardware storage device, wherein the second portion comprises a size such that the second portion exceeds a size of a second single block of the hardware storage device by the first fractional value, and wherein the second single block comprises a second to last sector/block of the hardware storage device; storing, by the processor, the first portion within the first single block; compressing, by the processor, the second portion of the first file such that a resulting compressed file fits entirely within the second single block of the hardware storage device; and storing, by the processor, the resulting compressed file within the second single block.

A third aspect of the invention provides a computer program product comprised by a computer readable hardware storage device storing a computer readable program code, the computer readable program code comprising an algorithm that when executed by a processor of the hardware storage device implements a storage optimization method, the method comprising: identifying, by the processor, a first file of a plurality of files for storage on the hardware storage device; determining, by the processor, that the first file comprises a first file size that exceeds first multiple physical disk blocks of the hardware storage device by a first fractional value; dividing, by the processor, the first file into a first portion and a second portion, wherein the first portion comprises a file size such that the first portion fits entirely within a first single block of the hardware storage device, wherein the second portion comprises a size such that the second portion exceeds a size of a second single block of the hardware storage device by the first fractional value, and wherein the second single block comprises a second to last sector/block of the hardware storage device; storing, by the processor, the first portion within the first single block; compressing, by the processor, the second portion of the first file such that a resulting compressed file fits entirely within the second single block of the hardware storage device; and storing, by the processor, the resulting compressed file within the second single block.

The present invention advantageously provides a simple method and associated system capable of maintaining information.

DETAILED DESCRIPTION

Figure 1:
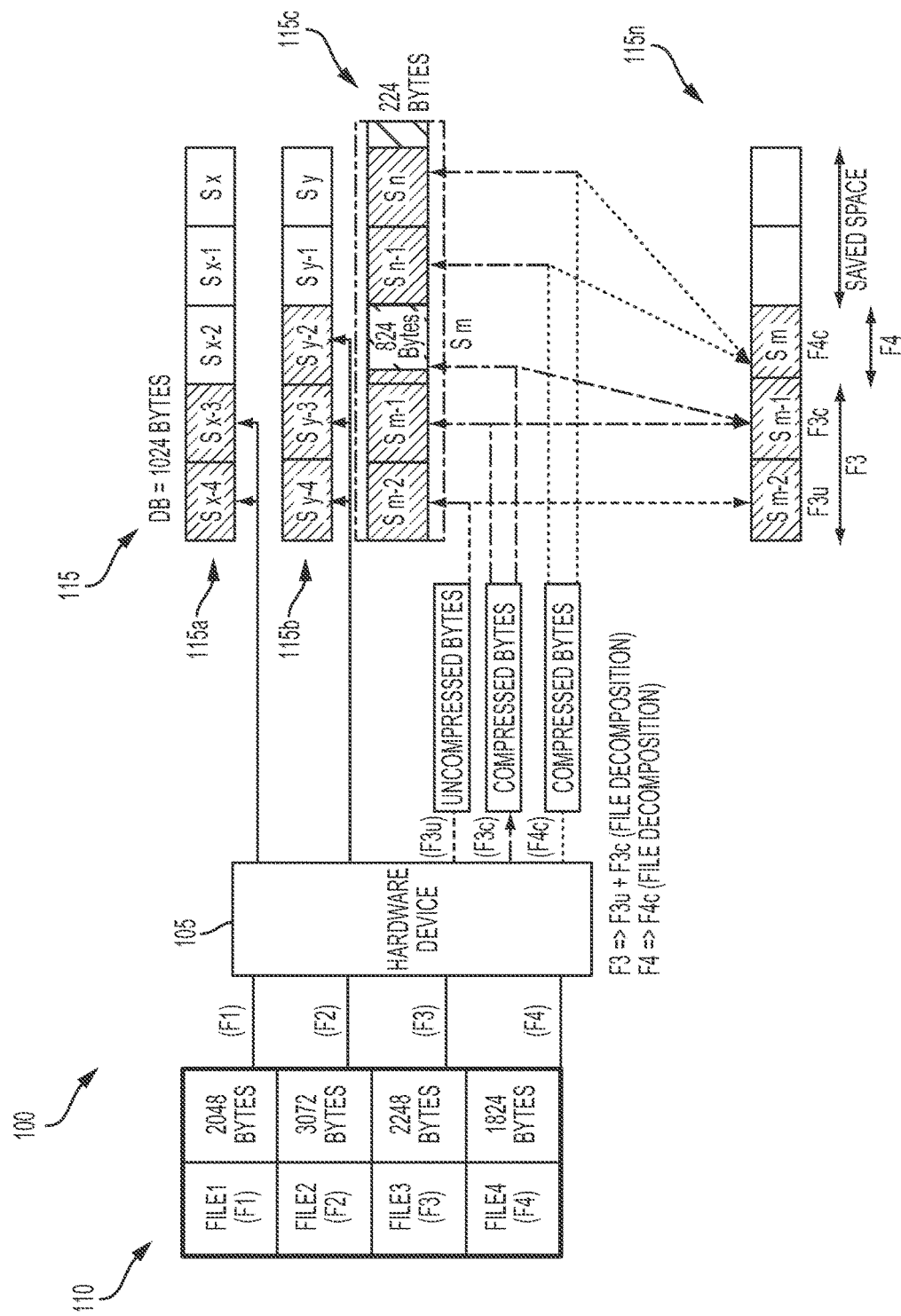
FIG. 1 illustrates an optimization process comprising a hardware storage device being executed with respect to a write process, in accordance with embodiments of the present invention.

FIG. 1 illustrates an optimization process comprising hardware storage device 100 being executed with respect to a write process, in accordance with embodiments of the present invention. Hardware storage device 100 enables a process for optimizing storage at a sector/block level within hardware storage device 100. Hardware storage device 100 executes a compression algorithm for compressing files at file/block level such that resulting compressed files may be stored exactly within an integer number of physical blocks without wasting storage block space. Hardware storage device 100 decomposes files for compression purposes based on a physical block size limitation of hardware storage device 100 at a file level. For example, files may be compressed as a nearest (maximum or minimum) function of a physical block size. Hardware storage device 100 enables a user to activate/deactivate an associated compression technique based on a threshold value determined based on wasted space in a disk sector.

Hardware storage device 100 include files 110 (for storage), a hardware controller 105 (e.g., a disk controller), and a storage disk 115 comprising blocks 115$a$ . . . 115$n$. Hardware controller 105 may comprise an embedded computer executing a specialized software application for controlling functionality. An embedded computer is defined herein as a remotely portable dedicated computer comprising a combination of computer hardware and software (fixed in capability or programmable) specifically designed for executing a specialized function. Programmable embedded computers may comprise specialized programming interfaces. Additionally, hardware controller 105 may comprise a specialized hardware device comprising specialized (non-generic) hardware and circuitry (i.e., specialized discrete non-generic analog, digital, and logic based circuitry) for executing a process described with respect to FIGS. 1-3. The specialized discrete non-generic analog, digital, and logic based circuitry may include proprietary specially designed components (e.g., a specialized integrated circuit designed for only implementing an automated process for optimizing storage at a sector/block level within hardware storage device 100).

Hardware storage device 100 enables the following process:

1. Files 110 are generated on an operating system level, a database level, a middleware level, an application level, or a storage level.
2. Hardware storage device 100 identifies files that do not conform to an integer with respect to a physical disk block size. For example, files that may not be stored as an integer of a physical block size are identified thereby allowing a portion of a file to occupy a space that is less than a physical block size in a last block.
3. During a file/data write (storage) process, hardware storage device 100 deforms the file into two portions. A first portion remains uncompressed and is written onto hardware storage device 100 to fit into an exact disk block size and a second portion is compressed. The compression process is as follows: Data for an nth block, a last block, and an (n−1) block is compressed in contiguous form such that hardware storage device 100 writes the compressed data to completely fit into the nth block. The aforementioned process is enabled via execution of a formula as follows: Fnc=f (Cr), (n−1), (n) with a compression ratio of "Cr".
Fnu=Uncompressed portion/stream of a file, F i.e., (n−2), (n−3), etc.
Fnc=Compressed portion of file (Fnc< or =physical block size)

Blocks 115$a$ and 115$b$ illustrate block sections comprising files (F1 and F2, respectively) that fit entirely within single blocks without any extra fractional portions. Block 115$c$ illustrates files F3 and F4 being stored uncompressed thereby causing wasted storage space. Block 115$n$ illustrates (an alternative storage process from the block 115$c$) files F3 and F4 comprising portions being stored uncompressed and portions being stored compressed to fit files F3 and F4 entirely into associated blocks for storage thereby eliminating causing wasted storage space.

The following implementation example describes an optimization process with respect to FIG. 1:

A data file stream, F of 2248 bytes (i.e. 1001101001000 . . . 11011001) is presented for storage on a storage device. Each block on the storage device comprises a physical block size equal to 1024 bytes. In response, the storage device identifies a file F as a special fractional portion of the file that would occupy only 200 bytes of a last sector of the storage device (i.e., 1024+1024=200). The storage device applies a formula1 (F=Fu+Fc) to divide the special file F described as follows:

Fu=(1024 bytes, n−2) being written onto the storage device without compression to occupy a complete block or sector of the storage device. The remaining portion is compressed with a compression ration Cr and therefore Fc becomes:

Fc=f{(Cr) (1024 bytes i.e. n−1) (200 bytes i.e. n)}<=1024 bytes (i.e., physical block size). Fc is written on a next block or sector of the storage device thereby occupying an entire next block or sector of the storage device. Additionally, a user may specify when the storage device should apply the aforementioned process based on a space being wasted on the hardware device. Therefore, the above formula is applied only when a wasted space is determined to be greater than X % of the physical block size.

Figure 2:
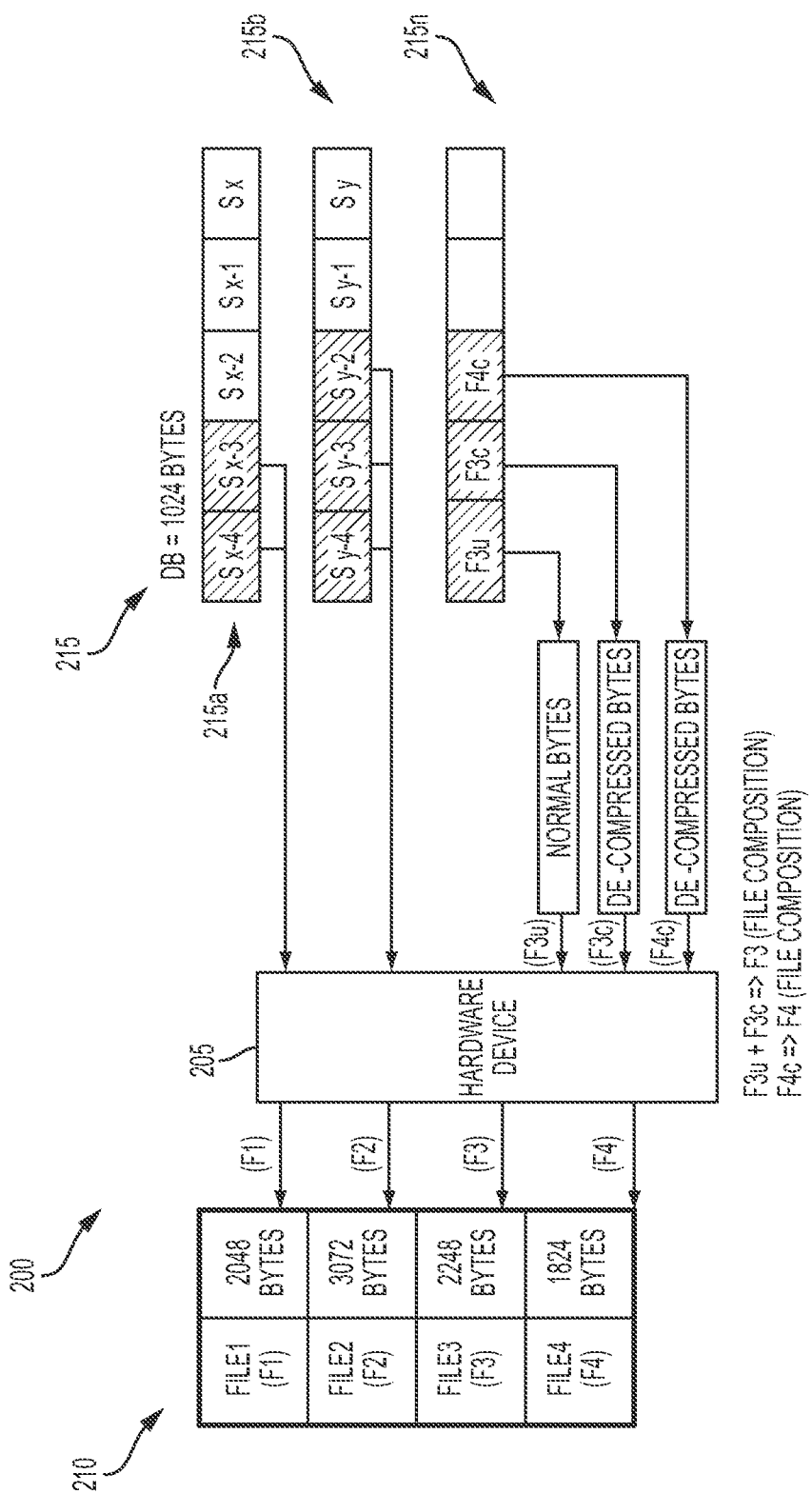
FIG. 2 illustrates an optimization process comprising a hardware storage device being executed with respect to a read process, in accordance with embodiments of the present invention.

FIG. 2 illustrates an optimization process comprising a hardware storage device 200 being executed with respect to a read process, in accordance with embodiments of the present invention. Hardware storage device 200 of FIG. 2 comprises a same hardware storage device as hardware storage device 100 of FIG. 1. Hardware storage device 200 executes a decompression algorithm for decompressing files that were compressed during the process executed with respect to FIG. 1. During a file/data read process, hardware storage device 200 reforms original files by reading or combining file portions deformed with respect to FIG. 1. For example, the first portion (of FIG. 1) is read as is via a normal read operation and the second portion (of FIG. 1) is decompressed before reading. Additionally, the file/data write or read process may be enabled or disabled by defining a threshold value with respect to an amount of wastage space on a last disk block.

Blocks 215$a$ and 215$b$ illustrate block sections comprising files (F1 and F2, respectively) that may read from single blocks without any decompression. Block 215$n$ illustrates files F3 and F4 comprising portions that must be decompressed before reading.

Figure 3:
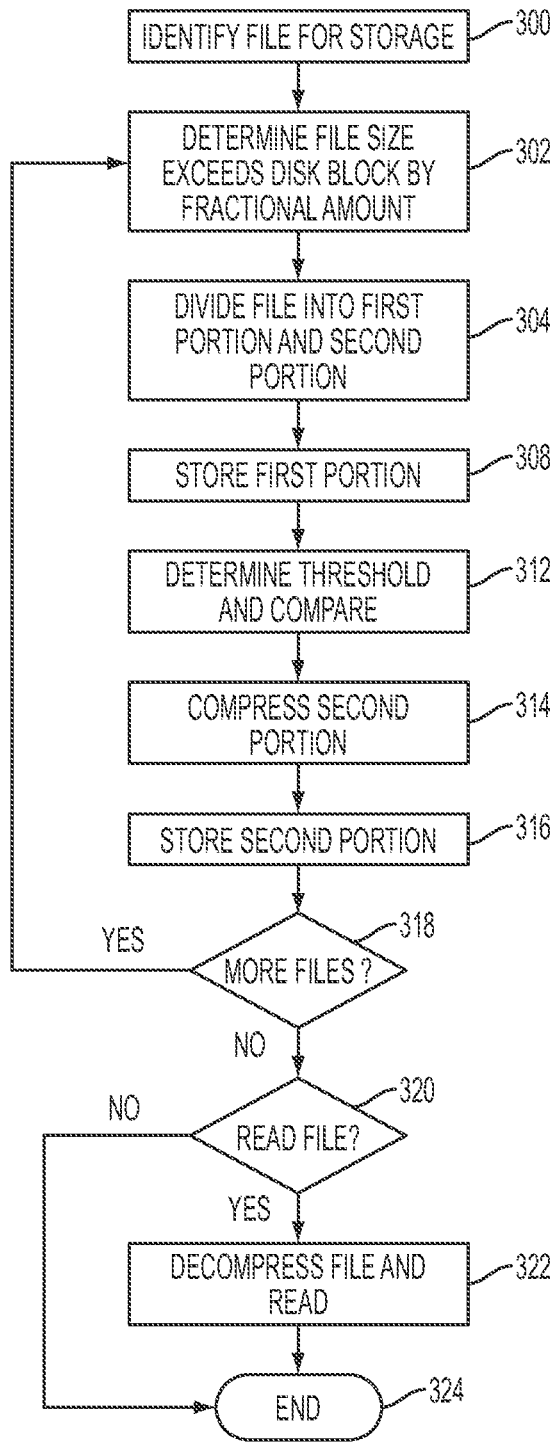
FIG. 3 illustrates an algorithm detailing a process flow enabled by the hardware storage devices of FIGS. 1 and 2 for optimizing block storage within a hardware storage device, in accordance with embodiments of the present invention.

FIG. 3 illustrates an algorithm detailing an optimization method enabled by hardware storage device 100 of FIG. 1 and hardware storage device 200 of FIG. 2 for optimizing block storage within a hardware storage device, in accordance with embodiments of the present invention. Each of the steps in the algorithm of FIG. 3 may be enabled and executed in any order by a computer processor(s) executing computer code. In step 300, a file of (a plurality of files) for storage on the hardware storage device is identified. In step 302, it is determined that the file comprises a file size that exceeds multiple physical disk blocks of the hardware storage device by a fractional value. In step 304, the file is divided into a first portion and a second portion. The first portion comprises a file size such that the first portion fits entirely within a single block of the hardware storage device. The second portion comprises a size such that the second portion exceeds a size of a single block of the hardware storage device by the fractional value. The second single block comprises a second to last sector/block of the hardware storage device. In step 308, the first portion is stored within the first single block. In step 312, a threshold percentage value associated with a specified percentage of the multiple physical disk blocks (associated with wasted disk space) is determined and compared to the second portion of the file. If results of the comparison indicate that wasted storage space of the multiple physical disk blocks is greater than the threshold percentage value then in step 314, the second portion of the file is compressed such that a resulting compressed file fits entirely within a second single block of the hardware storage device. In step 316, the resulting compressed file is stored within the second single block. In step 318, it is determined if any more files require storage. If in step 318, it is determined that more files require storage then the process is repeated (for another file) initiating at step 302. If in step 318, it is determined that no more files require storage then in step 320 it is determined if a read operation with respect to the original (partially compressed) file has been requested. If in step 320 it is determined that a read operation with respect to the original (partially compressed) file has not been requested then the process is terminated in step 324. If in step 320 it is determined that a read operation with respect to the original (partially compressed) file has been requested then in step 322 the following process is executed:

The first portion of the file (i.e., the uncompressed portion) is retrieved from the first single block. The resulting compressed file of step 314 is retrieved from the second single block and decompressed resulting in the second portion of the file being decompressed. The first un compressed portion is combined with the decompressed second portion resulting in a reconstruction of the original file and the original file is read.

Figure 4:
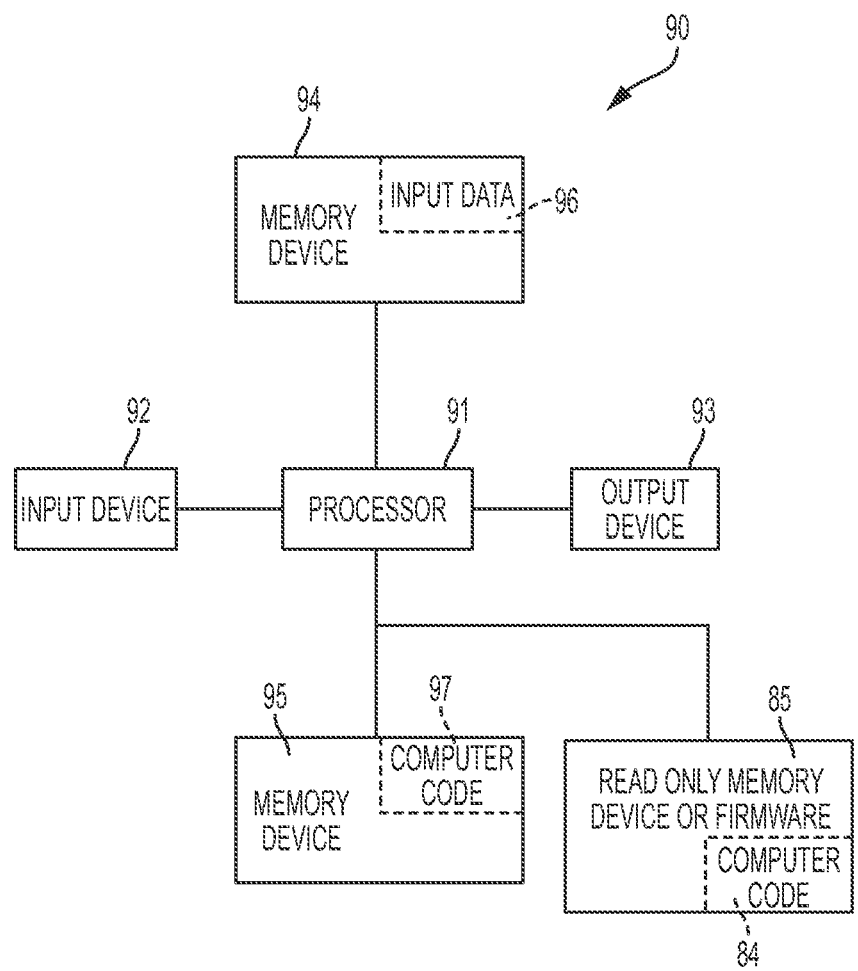
FIG. 4 illustrates a computer system used by or comprised by the hardware storage devices of FIGS. 1 and FIG. 2 for enabling a process for optimizing block storage within a hardware storage device, in accordance with embodiments of the present invention.

FIG. 4 illustrates a computer system 90 used by or comprised by hardware storage device 200 and 300 of FIG. 1 and FIG. 2 for enabling a process for optimizing block storage within a hardware storage device, in accordance with embodiments of the present invention.

Aspects of the present invention may take the form of an entirely hardware embodiment, an entirely software embodiment (including firmware, resident software, microcode, etc.) or an embodiment combining software and hardware aspects that may all generally be referred to herein as a "circuit," "module," or "system."

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing apparatus receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, device (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing device to produce a machine, such that the instructions, which execute via the processor of the computer or other programmable data processing device, create means for implementing the functions/acts specified in the flowchart and/or block diagram block or blocks. These computer readable program instructions may also be stored in a computer readable storage medium that can direct a computer, a programmable data processing device, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing device, or other device to cause a series of operational steps to be performed on the computer, other programmable device or other device to produce a computer implemented process, such that the instructions which execute on the computer, other programmable device, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The computer system 90 illustrated in FIG. includes a processor 91, an input device 92 coupled to the processor 91, an output device 93 coupled to the processor 91, and memory devices 94 and 95 each coupled to the processor 91. The input device 92 may be, inter alfa, a keyboard, a mouse, a camera, a touchscreen, etc. The output device 93 may be, inter alfa, a printer, a plotter, a computer screen, a magnetic tape, a removable hard disk, a floppy disk, etc. The memory devices 94 and 95 may be, inter alfa, a hard disk, a floppy disk, a magnetic tape, an optical storage such as a compact disc (CD) or a digital video disc (DVD), a dynamic random access memory (DRAM), a read-only memory (ROM), etc. The memory device 95 includes a computer code 97. The computer code 97 includes algorithms (e.g., the algorithms of FIG. 3) for enabling a process for optimizing block storage within a hardware storage device. The processor 91 executes the computer code 97. The memory device 94 includes input data 96. The input data 96 includes input required by the computer code 97. The output device 93 displays output from the computer code 97. Either or both memory devices 94 and 95 (or one or more additional memory devices Such as read only memory device 96) may include the algorithms of FIG. 3 and may be used as a computer usable medium (or a computer readable medium or a program storage device) having a computer readable program code embodied therein and/or having other data stored therein, wherein the computer readable program code includes the computer code 97. Generally, a computer program product (or, alternatively, an article of manufacture) of the computer system 90 may include the computer usable medium (or the program storage device).

In some embodiments, rather than being stored and accessed from a hard drive, optical disc or other writeable, rewriteable, or removable hardware memory device 95, stored computer program code 84 (e.g., including the algorithm of FIG. 3) may be stored on a static, nonremovable, read-only storage medium such as a Read-Only Memory (ROM) device 85, or may be accessed by processor 91 directly from such a static, nonremovable, read-only medium 85. Similarly, in some embodiments, stored computer program code 97 may be stored as computer-readable firmware 85, or may be accessed by processor 91 directly from such firmware 85, rather than from a more dynamic or removable hardware data-storage device 95, such as a hard drive or optical disc.

Still yet, any of the components of the present invention could be created, integrated, hosted, maintained, deployed, managed, serviced, etc. by a service supplier who offers to enable a process for optimizing block storage within a hardware storage device. Thus, the present invention discloses a process for deploying, creating, integrating, hosting, maintaining, and/or integrating computing infrastructure, including integrating computer-readable code into the computer system 90, wherein the code in combination with the computer system 90 is capable of performing a method for enabling a process for optimizing block storage within a hardware storage device. In another embodiment, the invention provides a business method that performs the process steps of the invention on a subscription, advertising, and/or fee basis. That is, a service supplier, such as a Solution Integrator, could offer to enable a process for optimizing block storage within a hardware storage device. In this case, the service supplier can create, maintain, support, etc. a computer infrastructure that performs the process steps of the invention for one or more customers. In return, the service supplier can receive payment from the customer(s) under a subscription and/or fee agreement and/or the service supplier can receive payment from the sale of advertising content to one or more third parties.

While FIG. 4 shows the computer system 90 as a particular configuration of hardware and software, any configuration of hardware and software, as would be known to a person of ordinary skill in the art, may be utilized for the purposes stated supra in conjunction with the particular computer system 90 of FIG. 4. For example, the memory devices 94 and 95 may be portions of a single memory device rather than separate memory devices.

While embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A storage optimization method comprising:
   determining, by a processor of a hardware storage device, that a first file of a plurality of files for storage on said hardware storage device comprises a first file size that exceeds first multiple physical disk blocks of said hardware storage device by a first fractional value;
   dividing, by said processor, said first file into a first portion and a second portion, wherein said first portion comprises a file size such that said first portion fits entirely within a first single block of said hardware storage device, wherein said second portion comprises a file size such that said second portion exceeds a size of a second single block of said hardware storage device by said first fractional value, and wherein said second single block comprises a second to last sector/block of said hardware storage device;

storing, by said processor, said first portion within said first single block;

determining, by said processor, a threshold percentage value associated with a specified percentage of a size of said first multiple physical disk blocks;

comparing by said processor, said second portion of said first file to said threshold percentage value;

determining, by said processor, that said second portion of said first file is associated with a wasted disk space portion of said first multiple physical disk blocks;

determining, by said processor based on results of said comparing, that said wasted disk space portion exceeds said threshold percentage value;

compressing, by said processor based on results of said comparing, said second portion of said first file such that a resulting compressed file fits entirely within said second single block of said hardware storage device; and storing, by said processor, said resulting compressed file within said second single block.

2. The method of claim 1, further comprising:
determining, by said processor based on said threshold percentage value, a specified technique for performing said compressing.

3. The method of claim 1, further comprising:
identifying, by said processor, a second file of said plurality of files for storage on said hardware storage device;
determining, by said processor, that said second file comprises a size that fits entirely within a third single block of said hardware storage device; and
storing, by said processor, said second file within said third single block.

4. The method of claim 1, further comprising:
receiving, by said processor, a request for reading said first file;
retrieving, by said processor in response to said request, said first portion from said first single block;
retrieving, by said processor, said resulting compressed file from said second single block;
decompressing, by said processor, said resulting compressed file resulting in said second portion of said first file being decompressed;
combining, by said processor, said first portion with said decompressed second portion resulting in a reconstruction of said first file; and
reading, by said processor, said first file.

5. The method of claim 1, further comprising:
modifying, by said processor, a file system layout and functionality with respect to a data structure used to represent a file system object, wherein said data structure comprises a bitmap for recognizing said second portion.

6. The method of claim 5, wherein said modifying is performed on an operating system level, a database level, a middleware level, an application level, or a storage level.

7. The method of claim 1, wherein said processor is comprised by a disk controller of said hardware storage device.

8. The method of claim 1, further comprising:
providing at least one support service for at least one of creating, integrating, hosting, maintaining, and deploying computer-readable code in the computing system, said code being executed by the computer processor to implement: said determining, said dividing, said storing said first portion, said compressing, and said storing said resulting compressed file.

9. A computing system comprising a processor coupled to a computer-readable memory unit, said memory unit comprising instructions that when executed by the processor executes a storage optimization method comprising:
determining, by said processor, that a first file of a plurality of files for storage on said hardware storage device comprises a first file size that exceeds first multiple physical disk blocks of said hardware storage device by a first fractional value;
dividing, by said processor, said first file into a first portion and a second portion, wherein said first portion comprises a file size such that said first portion fits entirely within a first single block of said hardware storage device, wherein said second portion comprises a file size such that said second portion exceeds a size of a second single block of said hardware storage device by said first fractional value, and wherein said second single block comprises a second to last sector/block of said hardware storage device;
storing, by said processor, said first portion within said first single block;
determining, by said processor, a threshold percentage value associated with a specified percentage of a size of said first multiple physical disk blocks;
comparing by said processor, said second portion of said first file to said threshold percentage value;
determining, by said processor, that said second portion of said first file is associated with a wasted disk space portion of said first multiple physical disk blocks;
determining, by said processor based on results of said comparing, that said wasted disk space portion exceeds said threshold percentage value;
compressing, by said processor based on results of said comparing, said second portion of said first file such that a resulting compressed file fits entirely within said second single block of said hardware storage device; and
storing, by said processor, said resulting compressed file within said second single block.

10. The computing system of claim 9, wherein said method further comprises:
determining, by said processor based on said threshold percentage value, a specified technique for performing said compressing.

11. The computing system of claim 9, wherein said method further comprises:
identifying, by said processor, a second file of said plurality of files for storage on said hardware storage device;
determining, by said processor, that said second file comprises a size that fits entirely within a third single block of said hardware storage device; and
storing, by said processor, said second file within said third single block.

12. The computing system of claim 9, wherein said method further comprises:
receiving, by said processor, a request for reading said first file;
retrieving, by said processor in response to said request, said first portion from said first single block;
retrieving, by said processor, said resulting compressed file from said second single block;
decompressing, by said processor, said resulting compressed file resulting in said second portion of said first file being decompressed;

combining, by said processor, said first portion with said decompressed second portion resulting in a reconstruction of said first file; and reading, by said processor, said first file.

13. The computing system of claim 9, wherein said method further comprises:

modifying, by said processor, a file system layout and functionality with respect to a data structure used to represent a file system object, wherein said data structure comprises a bitmap for recognizing said second portion.

14. The computing system of claim 13, wherein said modifying is performed on an operating system level, a database level, a middleware level, an application level, or a storage level.

15. The computing system of claim 9, wherein said processor is comprised by a disk controller of said hardware storage device.

16. A computer program product comprised by a computer readable hardware storage device storing a computer readable program code, said computer readable program code comprising an algorithm that when executed by a processor of said hardware storage device implements a storage optimization method, said method comprising:

determining, by said processor, that a first file of a plurality of files for storage on said hardware storage device comprises a first file size that exceeds first multiple physical disk blocks of said hardware storage device by a first fractional value;

dividing, by said processor, said first file into a first portion and a second portion, wherein said first portion comprises a file size such that said first portion fits entirely within a first single block of said hardware storage device, wherein said second portion comprises a file size such that said second portion exceeds a size of a second single block of said hardware storage device by said first fractional value, and wherein said second single block comprises a second to last sector/block of said hardware storage device;

storing, by said processor, said first portion within said first single block;

determining, by said processor, a threshold percentage value associated with a specified percentage of a size of said first multiple physical disk blocks;

comparing by said processor, said second portion of said first file to said threshold percentage value;

determining, by said processor, that said second portion of said first file is associated with a wasted disk space portion of said first multiple physical disk blocks;

determining, by said processor based on results of said comparing, that said wasted disk space portion exceeds said threshold percentage value;

compressing, by said processor based on results of said comparing, said second portion of said first file such that a resulting compressed file fits entirely within said second single block of said hardware storage device; and storing, by said processor, said resulting compressed file within said second single block.

17. The computer program product of claim 16, wherein said method further comprises:

determining, by said processor based on said threshold percentage value, a specified technique for performing said compressing.

18. The computer program product of claim 16, wherein said method further comprises:

identifying, by said processor, a second file of said plurality of files for storage on said hardware storage device;

determining, by said processor, that said second file comprises a size that fits entirely within a third single block of said hardware storage device; and storing, by said processor, said second file within said third single block.

19. The computer program product of claim 16, wherein said method further comprises:

receiving, by said processor, a request for reading said first file;

retrieving, by said processor in response to said request, said first portion from said first single block;

retrieving, by said processor, said resulting compressed file from said second single block;

decompressing, by said processor, said resulting compressed file resulting in said second portion of said first file being decompressed;

combining, by said processor, said first portion with said decompressed second portion resulting in a reconstruction of said first file; and reading, by said processor, said first file.

20. The computing program product of claim 16, wherein said method further comprises:

modifying, by said processor, a file system layout and functionality with respect to a data structure used to represent a file system object, wherein said data structure comprises a bitmap for recognizing said second portion.

* * * * *